Inventor:
Jerome J. Tiemann,
by John F. Ahern
His Attorney.

Inventor:
Jerome J. Tiemann,
by John F. Ahern
His Attorney.

3,358,158
SEMICONDUCTOR DEVICES

Jerome J. Tiemann, Burnt Hills, N.Y., assignor to General Electric Company, a corporation of New York Filed Apr. 13, 1965, Ser. No. 447,847
4 Claims. (Cl. 307—88.5)

Figure 1:
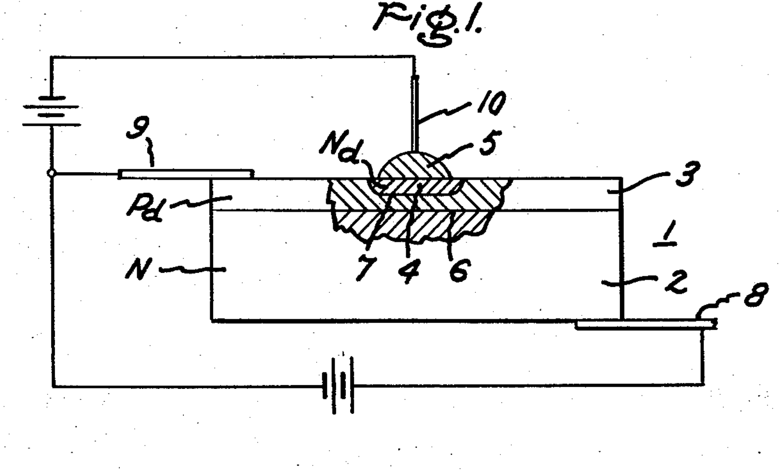

This application is a continuation-in-part of my application Ser. No. 87,433 filed Feb. 6, 1961, now abandoned, and assigned to the same assignee as the present application. This invention relates to semiconductor signal translating devices nad more particularly to such devices having separate input and output leads capable of extremely high frequency operation that have both high gain and are capable of operation at low temperature.

Prior art semiconductor devices having separate input and output leads fall into at least two categories. On the one hand, there are conventional transistors which operate by means of the diffusion of minority charge carriers, and on the other hand, there are field effect transistors which operate on the principle that the width of the space charge depletion region at a junction or at a surface depends on the applied potential across the junction or surface barrier.

In the case of ordinary transistors, carriers of one polarity (negative for electrons, positive for holes) are injected into a region of opposite conductivity type (P-type or N-type respectively).

Since P-type material contains an excess of holes, the injected electrons are referred to as minority carriers. Similarly, holes injected into a region of N-type conductivity are also referred to as minority carriers when they are within the bonundary of the N-type region. In order for such a device to operate, the minority carriers must traverse the entire thickness of the region of opposite conductivity type (this region is referred to as the "base" region) and be collected on the other side at a collector electrode. The transport of these carriers is determined by their diffusion, and drift. The diffusion process is both inherently slow and dependent on temperature. Generally speaking, diffusion is faster at higher temperatures and slower at lower temperatures. The transit time for carriers to cross the base region is an inherent limitation on the high frequency operation of these devices.

The phenomenon by which the field effect transistor operates is not particularly dependent on temperature, but to achieve a practical device, the resistivity of the active regions must be quite high, and a high resistivity region is subject to carrier freeze-out at low temperatures. By freeze-out is meant the process wherein a charge carrier, which is mobile at normal temperatures becomes trapped at an impurity site and is therefore rendered immobile. This effect is expected to make the field effect relatively unattractive at cryogenic temperatures.

It has long been known in the art that one of the factors greatly affecting the frequency response of such prior art semiconductor devices was the equivalent base resistance thereof. This equivalent base resistance is determined by the resistivity of the semiconductive material and thickness and cross-sectional area of the base region. All of these factors have been pushed to the limit in the construction of such devices. For example, base regions have been achieved which are so narrow as to be difficult to measure by macroscopic means. Base cross-sectional areas have likewise been made as small as possible consistent with available technology. In addition, it has been found that lowering the resistivity of the semiconductive material of the base region produces an undesirable lowering of the lifetime of the minority carriers therein and a corresponding decrease in the transport factor, $\alpha$, resulting in low efficiency.

Many important applications require devices capable of higher frequency operation than has been possible heretofore from devices of the type described above. In addition, other important electrical characteristics of semiconductor signal translating devices, besides capability of operation at high frequencies, are the input impedance and the power gain thereof at any frequency.

Additionally, and of great importance, the operation of a conventional transistor is severely limited at very low temperatures, as for example at cryogenic temperatures of 20° K. or lower by both carrier freze-out and lowered carrier diffusivity.

It is an object of this invention, therefore, to provide a new semiconductor signal translating device which avoids one or more of the limitations and disadvantages of prior art semiconductor devices of the type described above.

It is another object of this invention to provide a new semiconductor device utilizing a new mode of operation which is inherently much faster than the diffusion of charge carriers and, therefore, a device having a much higher operating frequency and more rapid response.

It is another object of this invention to provide a semicondutcor device having greatly improved operating characteristics, particularly at cryogenic temperatures.

It is another object of this invention to provide a semiconductor transistor device which is adapted for operation at extremely high frequencies.

Briefly stated, in accordance with one aspect of this invention, a new and improved semiconductor signal translating device comprises a plurality of P-N junction space charge regions, at least one of which is sufficiently narrow that the current at low voltages is determined essentially by the quantum mechanical tunneling process. More specifically, in one embodiment of this invention, such a device comprises a body of semiconductive material having therein a plurality of regions including, in order, a first region of one-type conductivity, a second region of at least approximately degenerate, opposite-type conductivity and a third region of degenerate material having the same type conductivity as that of the first region. The first region may be non-degenerate or degenerate, depending upon the operating characteristic sought. Thus if the transistor is to operate at cryogenic temperatures, the first region is preferably degenerate or approximately degenerate, but may be sufficiently doped with donor or acceptor impurities so that some carriers remain mobile at cryogenic temperatures so as to render the region conducting at cryogenic temperatures. Such a doping level will be referred to herein as "cryogenically-conductive."

The use of the term "degenerate" in a semiconductor device is intended to denominate a body or region of semiconductive material, which if N-type, has substantially all of the states or permitted values of energy near the bottom of the conduction band occupied by electrons as shown in the Fermi-level diagram for the semiconductive material. Similarly, if the semiconductive material is P-type the term "degenerate" refers to a body or region wherein substantially all of the states or permitted values of energy in an appreciable region near the top of the valence band are emptied of electrons.

In addition, as used throughout the specification and in the appended claims, the term "approximately degenerate" refers to a body or region of semiconductive material which, although containing a concentration of excess impurity which may be insufficient to render that body degenerate at room temperature, has a sufficient concentration of excess impurity therein that the P-N junction space charge region separating two such regions of opposite conductivity type, or one such region and a degenerate region, is sufficiently narrow to allow current at low voltages to be determined essentially by the quantum mechanical tunneling process.

The Fermi-level in such energy level diagrams is the level at which the probability of finding an electron in a particular state is equal to one half. Typical energy level diagrams for semiconductive materials may be found on pages 78, 87, 90, 142, 164 and 165 of the text entitled "Introduction to Semiconductors" by W. Crawford Dunlap, Jr., published in 1957 by John Wiley and Sons, Inc., New York.

The concentration of donor or acceptor impurity necessary to render a semiconductive material degenerate at room temperature varies depending upon the semiconductive material itself and upon the impurity material utilized. In germanium material, for example, the excess donor or acceptor concentration at which approximate degeneracy starts to occur is about $10^{18}$ atoms per cubic centimeter, and at about $10^{19}$ atoms per cubic centimeter, the material is definitely degenerate.

In like fashion the doping level at which semiconductors become "cryogenically-conductive" varies with semiconductor and dopant. However, the carrier concentration at which a sufficient number of ionized carriers remain to allow a substantial residual conductivity at cryogenic temperatures is usually about 1 decade below that at which degeneracy starts to occur.

Figure 2:
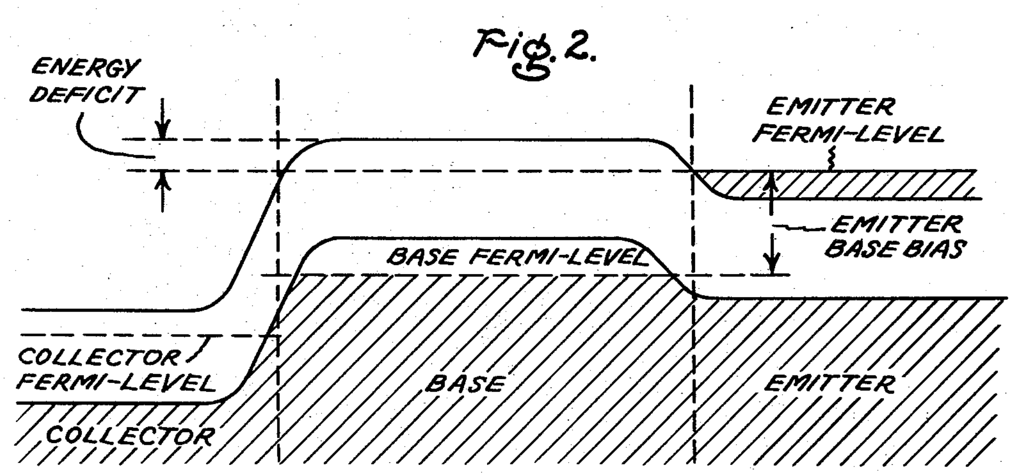
Figure 6:
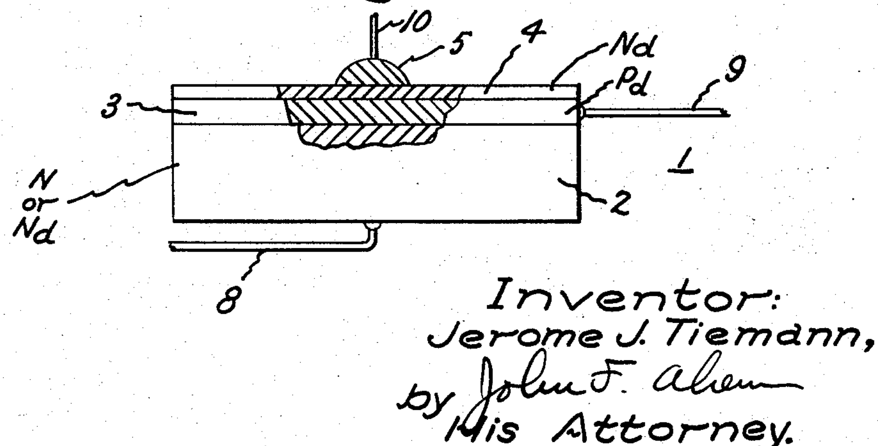
Figure 3:
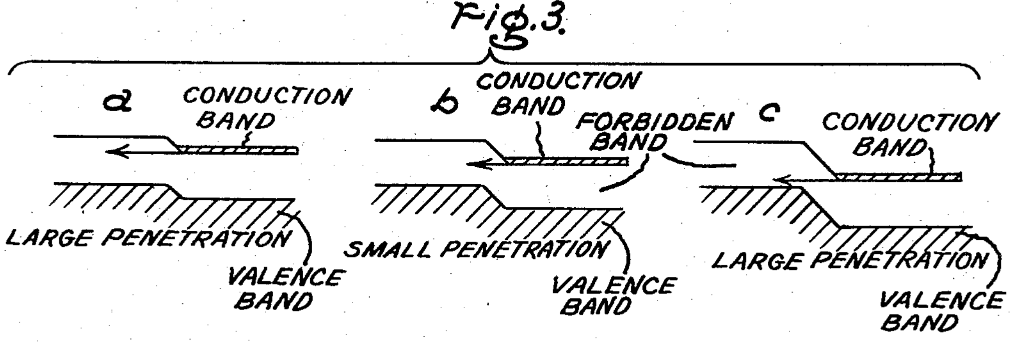
Figure 4:
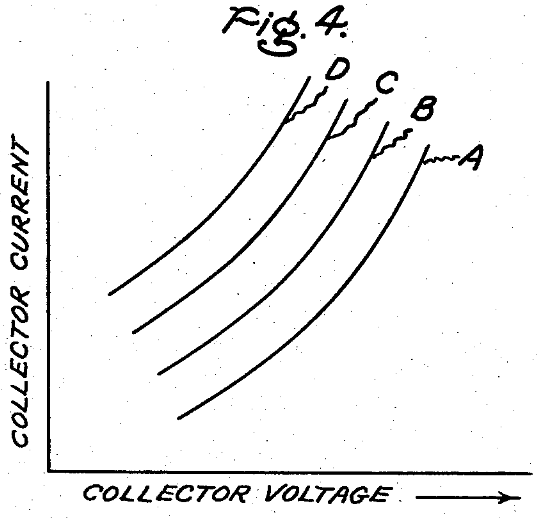
Figure 5:
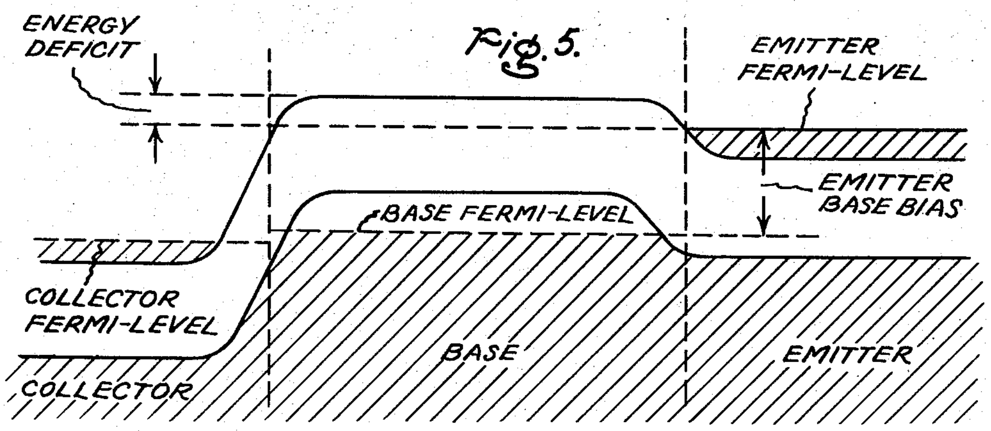

The features of my invention which I believe to be novel are set forth with particularity in the appended claims. My invention itself, however, both as to its organization and method of operation together with further objects and advantages thereof may best be understood by reference to the following description taken in conjunction with the accompanying drawing in which:

FIGURE 1 is a view partly in section of a semiconductor device constructed in accordance with this invention, FIGURE 2 is a diagram illustrating the different energy levels in the various regions of the device, FIGURE 3 illustrates various P-N junction energy level diagrams showing the penetration factor of tunneling carriers with respect to the forbidden gap, FIGURE 4 is a diagram illustrating a typical family of output characteristic curves of the device of FIGURE 1 for different emitter-base bias conditions, FIGURE 5 is an energy level diagram similar to FIGURE 2 but illustrating a different embodiment of the invention, and FIGURE 6 illustrates a structure alternative to that illustrated in FIGURE 1.

For the sake of clarity and simplicity in the following detailed description, the conductivity-type of each of the regions is shown on the drawing. The symbols $N_d$ and $P_d$ respectively are used to denominate those regions wherein the concentration of excess donor or acceptor impurity is sufficiently high to render that region at least approximately degenerate at room temperature such that the P-N junction space charge region separating those regions is of a width sufficiently narrow to allow the current at low voltages to be determined essentially by the quantum mechanical tunneling process. In addition, the semiconductor body is designated as being of N-type conductivity with a region of at least approximately degenerate P-type conductivity therein and a region of degenerate N-type conductivity within the at least approximately degenerate P-type region. It will be readily understood, however, that this invention is equally applicable to an N-P-N structure as shown or a P-N-P structure since, aside from a change in the polarity of the voltages, the basic electrical characteristics of such semiconductor devices are not altered by interchanging the N and P-type regions.

Further, although for simplicity of explanation the semiconductive material in the following description is referred to as germanium, it will be likewise understood that other semiconductive materials may be utilized such as, for example, silicon, silicon carbide, Group III–V compounds such as gallium arsenide and gallium antimonide, Group II–VI compounds such as cadmium telluride as well as semiconductive materials such as lead sulfide, lead telluride and lead selenide. Further, those semiconductive materials having a short minority carrier lifetime which are usually unsuitable for other known prior art semiconductor devices may be advantageously utilized in the construction of the semiconductor devices of this invention.

In FIGURE 1 there is shown a semiconductor device generally designated at 1 having therein a region first 2 of one-type conductivity and a second region 3 of semiconductive material impregnated with excess impurity to a concentration sufficient to render that region degenerate or at least approximately degenerate.

A third degenerate region 4 of conductivity-type opposite that of region 3 is formed in a portion thereof in any conventional manner known to the art. For example, such a degenerate regrown region may be formed by an impurity contact method utilizing known alloying and recrystallizing techniques wherein a small pellet 5 of a suitable conductivity-type imparting impurity material is fused to and alloyed with the at least approximately degenerate region 3. Alternatively, epitaxial growth techniques may be utilized to form a planar structure as illustrated in FIGURE 6 wherein like reference numerals are used to identify like members.

Region 2 and the heavily impregnated at least approximately degenerate region 3 are separated by a P-N junction space charge region 6. Similarly, region 3 and degenerate region 4 are separated by a P-N junction space charge region 7. Since the region 4 is degenerate and region 3 is at least approximately so, the P-N junction 7 therebetween is very narrow, such that the current at low voltages is determined essentially by the quantum mechanical tunneling process. The region 3 constitutes the "base" region of the device while the regions 2 and 4 constitute the "collector" and "emitter" regions thereof respectively. The term "emitter" as used herein refers to the region forming the narrow abrupt P-N junction with the "base" region and does not refer to a region which "emits" or injects minority carriers into the base region as in the case of the usual prior art semiconductor devices. Separate nonrectifying connections 8, 9 and 10 are made to the regions 2, 3 and 4 respectively in any convenient manner as, for example, by means of a suitable solder.

The P-N junction regions 6 and 7 respectively are preferably provided as nearly plane-parallel with the "base" region 3 as possible in accordance with well-known fabrication techniques. It is essential that the "base" region completely separates and is in contact with the "emitter" and "collector" regions and that it approach the plane-parallel configuration of FIGURE 6 as nearly as possible for the purpose of uniform charge transport path and for the achievement of high frequencies.

In a typical device, according to one embodiment of the invention the semiconductor body or wafer of one-conductivity type may be about 0.1 centimeter square and about 0.02 centimeter in thickness having a resistivity in the range of about 0.001 to 10 ohm centimeters. Region 3 may conveniently be a diffused surface layer of opposite-type conductivity preferably about 50 to 500 angstrom units in thickness and at least approximately degenerate. Alternatively, the region 3 may be formed by any other method known in the art for establishing a layer or region of suitable thickness and conductivity-type, as for example, by epitaxial growth. The degenerate "emitter" region 4 has the same type (sign) conductivity as that of the body or wafer and may conveniently have a thickness of about 100 to 300 angstrom units; such thickness being readily controlled by the time and temperature employed in its formation, as is well-known.

Although the "base" region in the devices described above is extremely thin, preferably in the range of about 50 to 500 angstrom units or less, the sheet resistance of this layer is not as high as that of the base layer of a conventional transistor of similar width, because the resistivity of region 3 can be made much lower than would be possible in a conventional transistor. Region 3 can be much more heavily doped (lower resistivity) because the mechanism by which charge is transported from the emitter to the collector is not one of the injection of minority carriers and their subsequent diffusion or drift but rather one wherein majority carriers tranverse the narrow P-N junction space charge region formed between the two very heavily impregnated, high conductivity regions and the "base" region, by means of the "quantum mechanical tunnel effect." Although such tunneling is impossible in terms of classical physics, it is fully explained by the principles of quantum mechanics. In addition, this process of "quantum mechanical tunneling," with a theoretical frequency limit of about $10^6$ megacycles per second, is inherently a much higher frequency mechanism than the drift and diffusion mechanisms involved in the operation of prior art semiconductor devices. For more detailed information on the quantum mechanical principles of tunneling, reference may be had to "Principles of Modern Physics" by Robert B. Leighton, 1959, published by McGraw-Hill, New York, N.Y.

According to classical mechanics, for example, a particle which does not have enough energy to surmount the potential barrier of the emitter junction is excluded from the base region because its energy would be in the forbidden gap. According to quantum mechanics, however, such a particle is not completely excluded from the base region; the probability of finding the particle within the base region being a decreasing exponential function of the penetration distance and the energy deficit of the particle. Here, the energy deficit of the particle refers to the position on an energy level diagram relative to the forbidden gap. This may be shown particularly by FIGURE 2 which illustrates the different energy levels in the various regions of a semiconductor device constructed in accordance with this invention and showing the energy deficit of the tunneling majority carriers. The shaded portions refer to the energy levels which are occupied by electrons, and the unshaded portions to regions either where there are no states available or where the states are unoccupied by virtue of being appreciably higher in energy than the Fermi-level.

In FIGURE 1 the P-N junction space charge region 7 formed between at least approximately degenerate region 3 and degenerate region 4 is sufficiently narrow that majority carriers may "tunnel" thereacross in accordance with the quantum mechanical tunneling process. According to this tunneling process the penetration factor of a carrier in the forbidden gap is greater as the carrier energy approaches either band edge and smallest at the energies approximately midway in the forbidden gap. This variation in penetration factor may be illustrated by the energy level diagrams in FIGURE 3 showing different bias conditions of such a narrow P-N junction. For example, in FIGURE 3*a* the carrier energy is near the conduction band edge and a relatively large penetration is possible. The same is true for the energy diagram of FIGURE 3*c* wherein the carrier energy is near the valence band edge. On the other hand FIGURE 3*b* shows a very small penetration when the carrier energy is approximately midway of the band edges.

In operation the emitter-base junction 7 is biased in the forward direction, almost to the point where appreciable injection occurs. The tunneling probability from the emitter region through the base to collector region depends primarily on the energy deficit throughout the base region 3 rather than on the properties of region 4, 7, 6 and 2. Since no injection of minority carriers is required for the operation of the semiconductor devices of this invention the emitter-base junction is biased below the point where injection of minority carriers occurs, resulting in a relatively high input impedance. The emitter-base bias, however, determines the energy of the tunneling majority carriers and thereby the value of the energy deficit. The input impedance varies inversely with the emitter-base bias so that the proper bias is determined by the impedance level required to obtain the desired circuit performance.

The collector-base junction 6 is biased in the reverse direction at a point less than but near the "punch through" voltage. For example, the "punch through" voltage of a conventional semiconductor transistor device is reached when the depletion layer associated with a biased collector junction extends through the entire base region and reaches the emitter region. The penetration of the depletion layer into the intervening semiconductive material between collector and emitter is a function of the operating collector voltage and the resistivity of the intervening semiconductive material. In such normal transistor operation, minority carriers flow from emitter to collector through the region of merging of the emitter and collector depletion regions and are impelled by the high electric field existing there. In the devices of this invention, however, the depletion layer associated with the collector does not extend completely through the intervening region of semiconductive material to meet the space charge region of the emitter, but only far enough into the intervening region to intercept the exponentially decaying portion of the wave function of the emitter charge carriers. The rate of decay of the emitter carrier wave function depends inversely on the energy deficit of the majority carriers which have "tunneled" across the emitter-base junction. The energy deficit of the carriers is determined by the emitter-base bias. Therefore, a variation in the emitter-base bias results in the collector space charge region intercepting the emitter carrier wave function at a position of greater or less carrier probability density. The amplitude of the wave function at the collector and, hence the collector current, therefore, depends upon the emitter-base bias. A small signal impressed on the emitter-base results in the modulation of the collector current in accordance therewith whereby the device exhibits a transconductance. The transconductance may be either positive, negative or reactive depending upon the emitter-base bias and the current-voltage characteristic of the emitter-base junction. Typical collector current-voltage characteristic curves for various values of emitter-base bias are shown in FIGURE 4. The curves of FIGURE 4 illustrate a family of positive transconductance characteristics. Curve A of FIGURE 4 illustrates the current-voltage characteristic for zero emitter-base bias while curves B, C and D represent successively greater bias voltage.

In prior art semiconductor devices, whose operation depends upon the drift or diffusion of minority carriers, a low resistivity base region results in an undesirably low emitter efficiency. Prior art devices having thin base regions to achieve high frequency performance have, of necessity, utilized high resistivity base regions with the result that such devices posses an objectionably large series resistance. In the devices of the present invention, however, the base region is extremely thin and, at the same time, of very low resistivity material, resulting in a device having very low series resistance.

In the devices of this invention no injection of minority carries occurs so that low emitter efficiency normally associated with a low resistivity base region is not involved. Instead, operation depends upon the "tunneling" of majority carriers across the very narrow emitter-base junction space charge region. To achieve a sufficiently narrow P-N junction space charge region to allow appreciable tunneling, the semi-conductive material in the associated P-type and the N-type regions must be of very low resistivity; specifically, one region should be degenerate and the other at least approximately so. The penetration factor of the tunneling carriers into the forbidden gap depends upon the carrier energy with respect thereto. The collector junction is adapted by appropriate biasing to intercept the decaying end portion of the wave function of the tunneling carriers. The collector current, therefore, depends upon the energy at which the carriers "tunneled" across the forbidden band.

As noted hereinbefore, a particular usefulness of the basic concept of the present invention lies in the low temperature field. Devices in accord with the present invention operate upon the principle of quantum mechanical tunneling of majority charge carriers across a narrow P-N junction between two heavily doped regions, at least one of which is degenerately doped while the remainder is at least appoximately degenerate. This process is independent of temperature. Conventional transistors operate upon the principle of injection of minority charge carriers from an emitter region though a P-N space charge region into a base region of much higher resistivity and their diffusion therethrough as minority charge carriers. This process is dependent on temperature. More specifically, at very low, or cryogenic temperatures (about 20° K. or less), minority charge carriers are "frozen-out" at their impurity sites and are not available for conduction. This causes the resistance of the lightly doped base region of a conventional transistor to become very high, and operation of the device suffers therefrom. Quantum mechanical tunneling is not very dependent upon temperature, and the resistance of cryogenically conducting semiconductor material (heavily doped) is not increased as much by lowering the temperature to the cryogenic range.

Accordingly, in one embodiment of the invention a cryogenic transistor is formed and operates independent of temperature. In this embodiment all regions of the device must be heavily enough doped so that charge carrier "freeze-out" at low temperatures does not occur. In this embodiment, regions 3 and 4 remain degenerate and at least approximately degenerate, respectively, as in the other embodiments. Additionally, the doping of region 2 must be sufficiently high as to preclude low temperature "freeze-out." This may readily be accomplished by requiring that region 2 be either degenerate or approximately degenerate as defined herein. In FIGURE 5 an energy level diagram is shown for a system in which the collector region 2 is degenerate. This differs from FIGURE 2 only in that the collector Fermi-level is in the conduction band, above the band edge.

In addition to the foregoing, a cryogenic transistor may be constructed in accord with this embodiment of the invention if the emitter and base regions are doped as described hereinbefore and the collector region is "cryogenically conductive," that is, heavily enough doped so that a substantial conduction current occurs even at cryogenic temperatures. Typically such doping levels are about 2 orders of magnitude less than necessary to achieve definite degeneracy. For example, P-type gallium arsenide is still conductive at liquid helium temperatures at a doping level of $10^{17}$ atoms of donor impurity per cubic centimeter.

While only certain preferred features of my invention have been shown by way of illustration, many modifications and changes will occur to those skilled in the art. It is, therefore, to be understood that the appended claims are intended to cover all such modifications and changes as fall within the true spirit and scope of my invention.

What I claim as new and desire to secure by Letters Patent of the United States is:

1. A semiconductor device comprising: a semiconductive body consisting essentially of a first cryogenically conductive region of one conductivity-type, a second degenerate region in contact with said first region and having a conductivity-type opposite thereto, and a third degenerate region in contact with said second region having conductivity-type the same as that of said first region, said second region completely separating said first and third regions; means for externally biasing said second region; and first and second separate and substantially plane parallel P-N junctions separating said first and second and said second and third regions respectively, said second P-N junction exhibiting tunneling so that substantial charge transport between said third and first regions is produced by tunneling of majority carriers through said second P-N junction and said second region.

2. A semiconductor device comprising: a semiconductive body consisting essentially of a first cryogenically conductive region of one conductivity-type, a second region contiguous with said first region and being degenerate and of opposite conductivity-type, and a third region contiguous with said second region and being degenerate and of conductivity-type the same as that of said first region, said second region completely separating said first and third regions; a first substantially planar P-N junction separating said first and second regions; a second substantially planar P-N junction which exhibits tunneling separating said second and third regions so that substantial charge transport between said third and first regions of said device is produced by tunneling of majority carriers through said second P-N junction, said second junction being parallel to said first junction; means for forward biasing said second P-N junction below the point where appreciable minority carrier injection occurs; and means for reverse biasing said first P-N junction at a point less than but near the punch-through voltage of said second region.

3. A semiconductive device comprising: a body of semiconductive material consisting essentially of three regions including in order, a first region constituted of cryogenically conductive one-type conductivity material, a second region constituted of at least approximately degenerate opposite-type conductivity material and a third region constituted of degenerate material of said one-type conductivity; said second region completely separating and in contact with said first and third regions; means for externally biasing said second region; and a first substantially planar P-N junction between said first and second regions, a second substantially planar P-N junction between said second and third regions, said second junction being parallel to said first junction and sufficiently narrow to exhibit tunneling so that its current at low voltage is determined essentially by the quantum mechanical tunneling process, and said second region being of sufficiently small thickness to permit substantial transport of charged tunneling majority carriers therethrough between said first and third regions and provide amplification.

4. The semiconductor device of claim 3 wherein said second region of said semiconductive body has a thickness in the range of about 50 to 500 angstrom units.

References Cited

UNITED STATES PATENTS

| | | | |
|---|---|---|---|
| 3,018,423 | 1/1962 | Aarons et al. | 148—33.1 |
| 3,027,501 | 3/1962 | Pearson | 148—33.1 |
| 3,090,014 | 5/1963 | Dacey | 317—234 |
| 3,098,160 | 7/1963 | Noyce | 317—234 |
| 3,225,272 | 12/1965 | Cronemeyer | 317—235 |

FOREIGN PATENTS 945,101 12/1963 Great Britain.

CHARLES N. LOVELL, *Primary Examiner.*

DAVID L. RECK, HYLAND BIZOT, *Examiners.*